United States Patent [19]

Karnavas

[11] Patent Number: 5,536,181
[45] Date of Patent: Jul. 16, 1996

[54] CONNECTOR SOCKET ALIGNMENT GUIDE

[76] Inventor: E. C. Karnavas, 6919 Alpha Rd., Dallas, Tex. 75240

[21] Appl. No.: 274,398

[22] Filed: Jul. 12, 1994

[51] Int. Cl.⁶ .............................................. H01R 13/629
[52] U.S. Cl. ........................... 439/381; 439/70; 439/689
[58] Field of Search ................................. 439/381, 689, 439/70, 526

[56] References Cited

U.S. PATENT DOCUMENTS

| | | | |
|---|---|---|---|
| 2,153,177 | 4/1939 | Ecker | 439/689 |
| 3,126,244 | 3/1964 | Raygor et al. | 439/686 |
| 3,274,533 | 9/1966 | Apted et al. | 439/689 |
| 3,487,350 | 12/1969 | Hammell | 439/70 |
| 3,621,444 | 11/1971 | Stein | 439/689 |
| 3,975,072 | 8/1976 | Ammon | 439/70 |
| 4,793,058 | 12/1988 | Venaleck | 29/845 |
| 4,935,581 | 6/1990 | Komathu | 174/52.4 |

*Primary Examiner*—Gary F. Paumen
*Attorney, Agent, or Firm*—Crutsinger & Booth

[57] ABSTRACT

Disclosed is a connector socket pin alignment guide comprising a plurality of straight walled essentially constant diameter short tubular guide paths, one for each contact pin, positioned adjacent the socket receptacle contacts of the connector.

12 Claims, 2 Drawing Sheets

CONNECTOR SOCKET ALIGNMENT GUIDE

The present invention relates to electrical connectors, sockets, and receptacles.

BACKGROUND OF THE INVENTION

Electrical connectors have long been used in electrical and electronic equipment to interconnect various parts of systems and equipments through multiconductor cables either within or between the enclosures housing the functional parts or subparts. Individual circuit components and functional elements and assemblies have become drastically miniaturized because of the availability of relatively inexpensive etched circuit component boards and semiconductor integrated circuits. As the number of circuit elements and functions embodied in each self-contained component increased, the number of electrical connections into and out of each component likewise increased. At the same time, the space available for such connections became severely limited as the size of the multifunctional components shrank.

Such circumstances and repair and replacement considerations have caused the industry to abandon many "hand wiring" techniques in favor of separable plug and socket connector techniques for component and subsystem interconnections. Progressing miniaturization has resulted in demand for smaller and smaller connectors with a steadily increasing number of individual connective elements or contacts. Connectors with up to 450 or more contact pins mounted on 0.050 inch centers on a base only 1.2 of an inch square and less than +3/16 inch thick are common. In a system of such size, the plug element pins may be about 0.020 inches in diameter and the pin receptacle elements may be about 0.040 inches outside diameter with openings of appropriate size to accept the pins with good electrical contact.

As can easily be understood, difficulties arise when it is attempted to insert the pins of the male pin or plug half of the connector quickly into the receptacle contacts of the female socket or receptacle half of the connector. The problem of exactly orienting the pins of plug base with the receptacle contacts of the socket base is aggravated by even a single pin being slightly out of alignment.

Obvious solutions to the insertion problems such as beveling the receptacle contact opening have proved unsatisfactory. The pins often "stick" in the conical walls of the openings and deform even more preventing full insertion of the plug end of the socket.

SUMMARY OF THE INVENTION

Contrary to what may be conventional thought, it has been found that the "plugging in" of the pins to the socket elements of the socket base of a highly miniaturized connector system is facilitated by providing a guide means with straight walled cylindrical lead-in paths on the receptacle base just above each of the individual socket receptacle contacts. While these straight walled paths guide the individual pins into their respective receptacle contacts of the sockets, contact between the end of the contact pin and the side wall is avoided and thus inadvertent bending or deformation of the pins is prevented.

BRIEF DESCRIPTION OF THE DRAWINGS

The promised advantages of the present invention will become apparent from the following detailed description of the preferred embodiments of the invention when read with reference to the accompanying drawings wherein.

DETAILED DESCRIPTION

Figure 1:
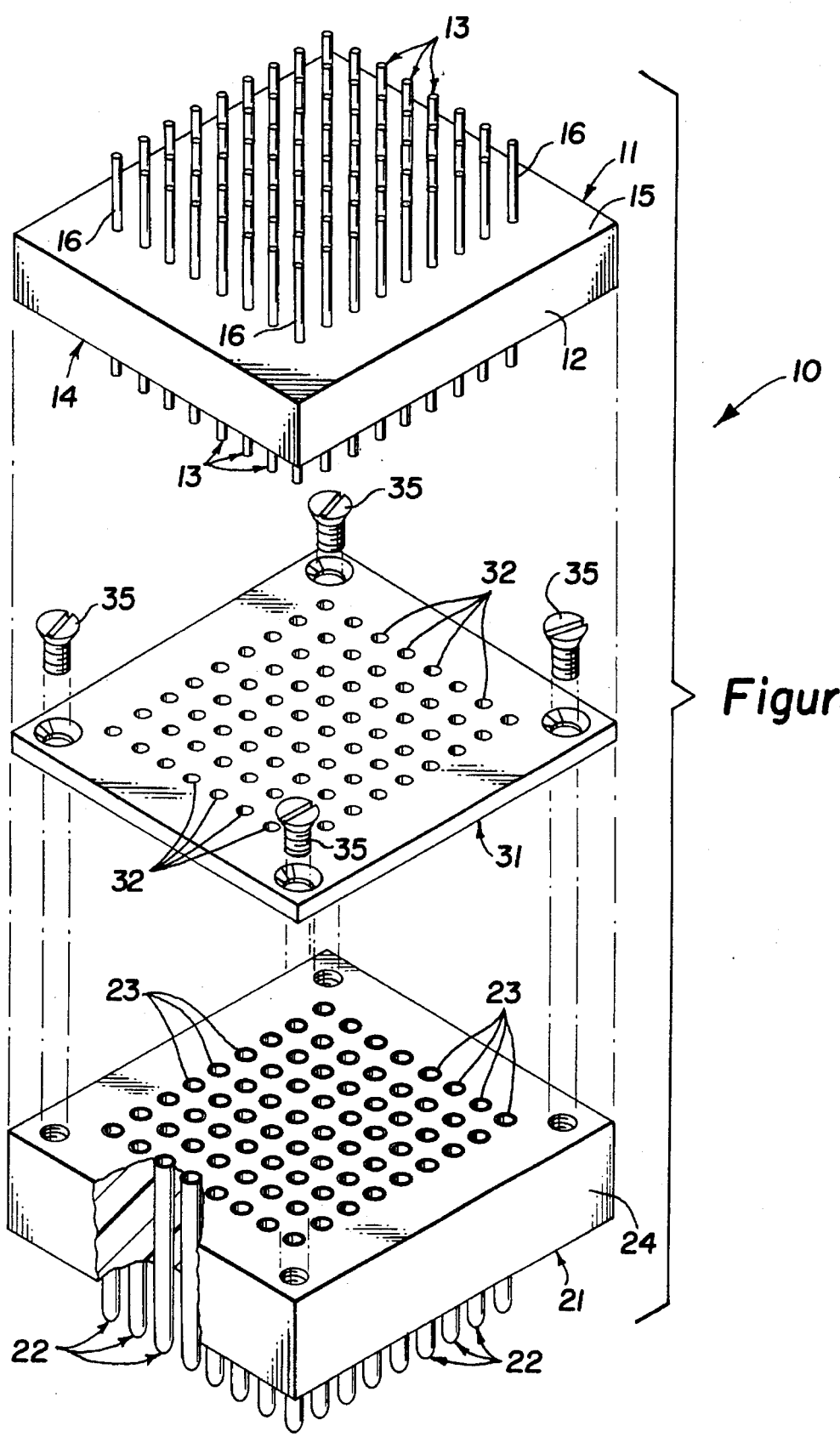
FIG. 1 is an exploded view in perspective of one form of the connector system of the present invention partly cut away, showing a pin alignment guide plate for attachment to the socket base.

Referring now to FIG. 1, there is shown in exploded perspective view a connector 10 incorporating a pin alignment guide according to the present invention. The connector system shown in FIG. 1 comprises the plug element 11 a receptacle element 21, and a lead-in guide 31.

Plug element 11 comprises a pin base 12 mounting a plurality of contact pins 13 secured in the base 12 and extending from the mating face 14 and the back face 15 of the base 12. Pins 13 are ordinarily solid metal of a generally cylindrical shape and may be of a steel, brass, bronze, or other suitable metallic material and may be plated with metallic materials such as gold or silver to enhance conductivity. The portions 16 of pins 13 extending from the backside is of pin base 12 are designed to accept wire or other conductor connections as is well known in the art.

A pin base of the described type will ordinarily support numerous contact pins 13, up to 450 or more for example, arranged in a pattern mirrored by the receptacle contact pattern in the receptacle or socket element 21. Receptacle contacts 22 are tubular metal elements of material similar to those of pins 13 and are designed to receive in their open ends 23 the contact pins 13 in sliding contact within them to provide good electrical contacts over a substantial portion of their length in a friction fit as is well known in the art.

Contact pins 13 may typically have a diameter on the order of about 0.020 inches and be arranged in the pin base 12 in a regular group pattern with center spacing on the order of about 0.050 inches. Receptacle contacts 22 must have an internal diameter to receive the contact pins 13 with good electrical contact and also must have an external diameter small enough to be supported in the receptacle element base 24 in a corresponding pattern of 0.050 inch center spacing.

The difficulty of properly mating and inserting such small size multiple contact pins 13 of the plug element 11 into the multiple receptacle contacts 22 of the socket element 21 especially when the number of pins exceeds about 20 is obvious. The contact pins 13 are easily bent when the plug element and the socket element are misaligned during insertion attempts. Once one or more of the contact pins 13 are bent it is almost impossible thereafter to properly insert the pins in the receptacle contacts. Provision of a bevelled or conically shaped opening in the receptacle contacts to guide the pins is difficult to achieve and does not alleviate the problem as might be expected.

It has been found that provision of a straight walled cylindrical lead-in path to the individual receptacle contacts unexpectedly greatly reduced, in fact, almost eliminated the insertion problem.

In the embodiment of the invention shown in FIG. 1, the straight walled cylindrical lead-in paths are supplied by a relatively thin lead-in guide plate 31 having a plurality of drilled holes 32 therein matching the plug pin and socket receptacle contact pattern and being attached to the socket element 21 such as by four corner screws 35. The holes 32 of the lead-in guide 31 may conveniently be of the same diameter as the holes drilled in the socket element base 24 to accommodate the receptacle contacts 22, for example about 0.040 inches in diameter. Convenience is found in the fact that the same drilling setup and drills used to drill the receptacle element base 24 itself is used to drill the guide holes 32 and the lead-in guide 31. An appropriate thickness for lead-in guide 31 has been found to be between about 0.020 and about 0.030 inches.

The lead-in guide 31 may be made of any suitable insulating plastic such as the same plastic as plug element pin base 12 and socket base 24.

Figure 2:
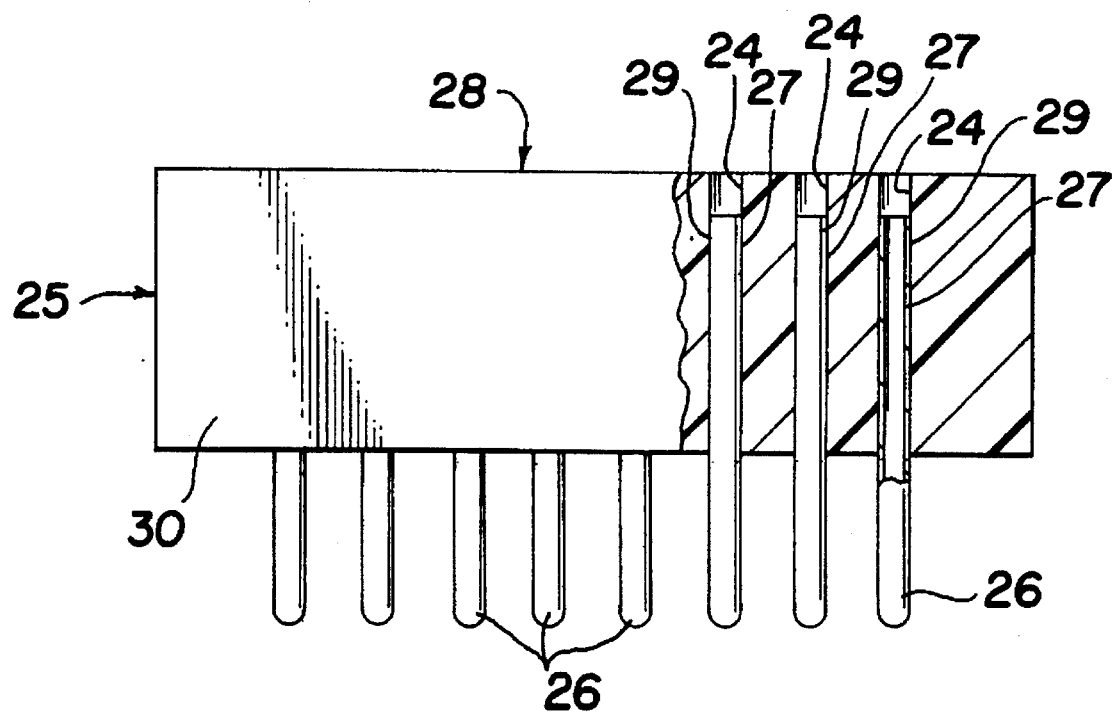
FIG. 2 is a side view partly cut away showing an alternative form of pin alignment guide embodying the principles of the present invention.

An alternative method of providing the straight walled cylindrical lead-in guide paths is illustrated in FIG. 2. FIG. 2 shows a front elevation partly in section of an alternative form of socket element 25. In socket base 30 receptacle contacts 26 are received in mounting holes 27 drilled in base 30 to provide a force fit for the contacts 26. Contacts 26 rather than being inserted in the socket base 30 to have their ends flush with the mounting surface 28 of the base 25 as in FIG. 1 are inserted so that their upper open ends 29 are a uniform distance of between about 0.020 and 0.030 inches below the mounting surface 28 of socket base 25. Thus, the upper portion 24 of the contact mounting holes 27 in socket base 25 provide a pattern of straight walled guide openings having a diameter essentially the same as the outside diameter of the receptacle contacts 26 just as provided by the lead-in guide plate 31 of FIG. 1 with respect to receptacle contact 22.

Thus, there has been disclosed a guide means for use with connector elements having extremely close spaced multiple contacts to facilitate the insertion of the connector pins into connector socket contacts with a minimum potential for bending or otherwise deforming the pins in a manner rendering the connector useless.

Many modifications and changes still within the spirit and scope of the disclosed inventions may occur to those skilled in the art and; therefore, this invention is to be limited only as set forth in the following claims.

What is claimed is:

1. An alignment guide to assist in the alignment of the ends of contact pins of a plug element of a multi-contact connector for use with highly miniaturized electrical circuit assemblies with matching receptacle contacts of a socket element of said connector for ease of insertion of said plug pins into said receptacle contacts comprising:

a relatively thin electrically insulating plate member having a plurality of openings therein forming a plurality of substantially straight walled essentially constant diameter pin guide paths, said plate member being positioned on and affixed to said socket element, each of said openings being positioned adjacent to and concentrically with the receiving end of one of said receptacle contacts of said socket element, said guide paths having a diameter no smaller than portions of openings in said socket element in which said receptacle contacts are mounted, said portions being immediately adjacent to said guide paths.

2. The alignment guide as defined in claim 1 wherein said guide member comprises a portion of said socket element supporting said receptacle contacts, said portion extending for a relatively short distance outwardly past the receiving ends of receptacle contacts.

3. The alignment guide as defined in claim 1 wherein said plate has a thickness of between about 0.020 and about 0.030 inches.

4. The alignment guide as defined in claim 2 wherein said relatively short distance is between about 0.020 and about 0.030 inches.

5. The alignment guide as defined in claim 1 wherein said guide paths are of essentially the same diameter as the openings in said socket element in which the receptacle contacts are mounted.

6. The alignment guide as defined in claim 4 wherein said guide paths are of essentially the same diameter as the openings in said socket element in which said receptacle contacts are mounted.

7. The alignment guide as defined in claim 5 wherein said guide paths are between about 0.020 and about 0.030 inches in diameter.

8. The alignment guide as defined in claim 6 wherein said guide paths are between about 0.020 and about 0.030 inches in diameter.

9. The alignment guide as defined in claim 7 wherein said guide paths are arranged in rows with spacing of from about 0.050 to about 0.100 inches between centers and in columns with spacing of from about 0.050 to about 0.100 inches between centers.

10. The alignment guide as defined in claim 8 wherein said guide paths are arranged in rows with spacing of from about 0.050 to about 0.100 inches between centers and in columns with spacing of from about 0.050 to about 0.100 inches between centers.

11. An alignment guide to assist in the alignment of the ends of contact pins of a plug element of a multi-contact connector for use with highly miniaturized electrical circuit assemblies with matching receptacle contacts of a socket element of said connector for ease of insertion of said plug pins into said receptacle contacts comprising:

a thin electrically insulating plate member having a plurality of substantially straight walled essentially constant diameter guide path openings therein, each of said openings having a diameter of between about 0.020 and about 0.030 inches, said plate being positioned on and affixed to said socket element, said plate member having a thickness of between 0.020 and about 0.030 inches, and being positioned adjacent to and concentrically with the receiving end of one of said receptacle contacts, said guide path openings are arranged in rows with spacing of from about 0.050 to about 0.100 inches between centers and in columns with spacing of from about 0.050 to about 0.100 inches between centers, said guide path openings having a diameter no smaller than portions of openings in said socket element in which said receptacle contacts are mounted, said portions being immediately adjacent to said guide paths.

12. An alignment guide to assist in the alignment of the ends of contact pins of a plug element of a multi-contact connector for use with highly miniaturized electrical circuit assemblies with matching receptacle contacts of a socket element of said connector for ease of insertion of said plug pins into said receptacle contacts comprising:

a plurality of substantially straight walled essentially constant diameter pin guide paths each positioned adjacent to and concentrically with the receiving end of one of said receptacle contacts of said socket element, said guide paths being embodied in a layer of electrically insulating material affixed to said socket element and each path being of a diameter no smaller than portions of mounting openings for said receptacle contacts in said socket element, said portions being immediately adjacent to said guide paths.

* * * * *